(12) United States Patent
Chen et al.

(10) Patent No.: US 8,772,123 B2
(45) Date of Patent: Jul. 8, 2014

(54) BAND GAP IMPROVEMENT IN DRAM CAPACITORS

(75) Inventors: Hanhong Chen, Milpitas, CA (US);
Sandra G. Malhotra, San Jose, CA (US); Wim Deweerd, San Jose, CA (US); Hiroyuki Ode, Higashihiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 251 days.

(21) Appl. No.: 13/237,065

(22) Filed: Sep. 20, 2011

(65) Prior Publication Data

US 2013/0071987 A1  Mar. 21, 2013

Related U.S. Application Data

(63) Continuation-in-part of application No. 12/942,238, filed on Nov. 9, 2010, now Pat. No. 8,415,657.

(51) Int. Cl.
*H01L 21/20* (2006.01)
(52) U.S. Cl.
USPC .................................. 438/396; 257/E29.079

(58) Field of Classification Search
USPC .................................. 438/396; 257/E29.079
See application file for complete search history.

(56) References Cited

U.S. PATENT DOCUMENTS

| | | | |
|---|---|---|---|
| 2003/0197205 A1* | 10/2003 | Marsh et al. | 257/200 |
| 2010/0302705 A1* | 12/2010 | Antonov et al. | 361/313 |
| 2011/0204475 A1* | 8/2011 | Rui et al. | 257/532 |
| 2012/0127629 A1* | 5/2012 | Roeder et al. | 361/322 |

* cited by examiner

*Primary Examiner* — Zandra Smith
*Assistant Examiner* — Jamie C Niesz

(57) ABSTRACT

A method for forming a DRAM MIM capacitor stack having low leakage current and low EOT involves the use of an compound high k dielectric material. The dielectric material further comprises a dopant. One component of the compound high k dielectric material is present in a concentration between about 30 atomic % and about 80 atomic % and more preferably between about 40 atomic % and about 60 atomic %. In some embodiments, the compound high k dielectric material comprises an alloy of $TiO_2$ and $ZrO_2$ and further comprises a dopant of $Al_2O_3$. In some embodiments, the compound high k dielectric material comprises an admixture of $TiO_2$ and $HfO_2$ and further comprises a dopant of $Al_2O_3$.

19 Claims, 3 Drawing Sheets

BAND GAP IMPROVEMENT IN DRAM CAPACITORS

This document relates to the subject matter of a joint research agreement between Intermolecular, Inc. and Elpida Memory, Inc

FIELD OF THE INVENTION

The present invention generally relates to the field of dynamic random access memory (DRAM), and more particularly to dielectric material processing for improved DRAM performance.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high k materials. As used herein, "high k" will be understood to refer to k-values of greater than about 10. Representative examples of high k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high k dielectric films in MIM capacitors in order to increase charge storage capacity. The goal is to utilize dielectric materials that exhibit an EOT of less than about 0.8 nm while maintaining a physical thickness of about 5-20 nm.

Generally, as the dielectric constant of a material increases, the band gap of the material decreases. For example. The rutile phase of TiO$_2$ has a k-value of about 80 and a band gap of about 3.0 eV while ZrO$_2$ in the tetragonal phase has a k-value of about 43 and a band gap of about 5.8 eV. This leads to high leakage current in the device. As a result, without the utilization of countervailing measures, capacitor stacks implementing high k dielectric materials may experience large leakage currents. High work function electrodes (e.g., electrodes having a work function of greater than 5.0 eV) may be utilized in order to counter the effects of implementing a reduced band gap high k dielectric layer within the DRAM capacitor. Metals, such as platinum, gold, ruthenium, and ruthenium oxide are examples of high work function electrode materials suitable for inhibiting device leakage in a DRAM capacitor having a high k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the heat-induced flow of charge over an energy barrier whereby the effective barrier height of a MIM capacitor controls leakage current. The effective barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through tunneling. As such, the Fowler-Nordheim emission behavior of a dielectric layer is generally determined by the physical thickness of the dielectric layer. This leakage current is a primary driving force in the adoption of high k dielectric materials. The use of high k materials allows the physical thickness of the dielectric layer to be as thick as possible while maintaining the required capacitance (see Eqn 1 above).

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C.) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

High k dielectric materials have been developed that exhibit low leakage current at low temperatures (i.e. room temperature), but exhibit unacceptably high leakage current at elevated temperatures (i.e. 90 C). For example, an Al-doped $TiO_2$ dielectric layer that achieves an EOT of 0.5 nm has exhibited leakage current of $3 \times 10^{-8}$ A/cm$^2$ at 0.6V. If the temperature is raised to 90 C, the leakage current increases to $2 \times 10^{-6}$ A/cm$^2$ at 0.6V. This is above the required specification of $1 \times 10^{-7}$ A/cm$^2$.

Therefore, there is a need to develop dielectric materials that exhibit a high k-value, a low EOT, and low leakage current for DRAM capacitors. Furthermore, the leakage current should remain low at elevated temperatures.

SUMMARY OF THE DISCLOSURE

In some embodiments of the present invention, a high k dielectric material such as the rutile phase of $TiO_2$ is admixed with a high k material such as $ZrO_2$ or $HfO_2$ that has a higher bandgap to produce a compound high k material that exhibits a high k value, a higher bandgap, and reduced leakage current. In some embodiments, the compound high k material is further doped with a metal dopant to further reduce the leakage current.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
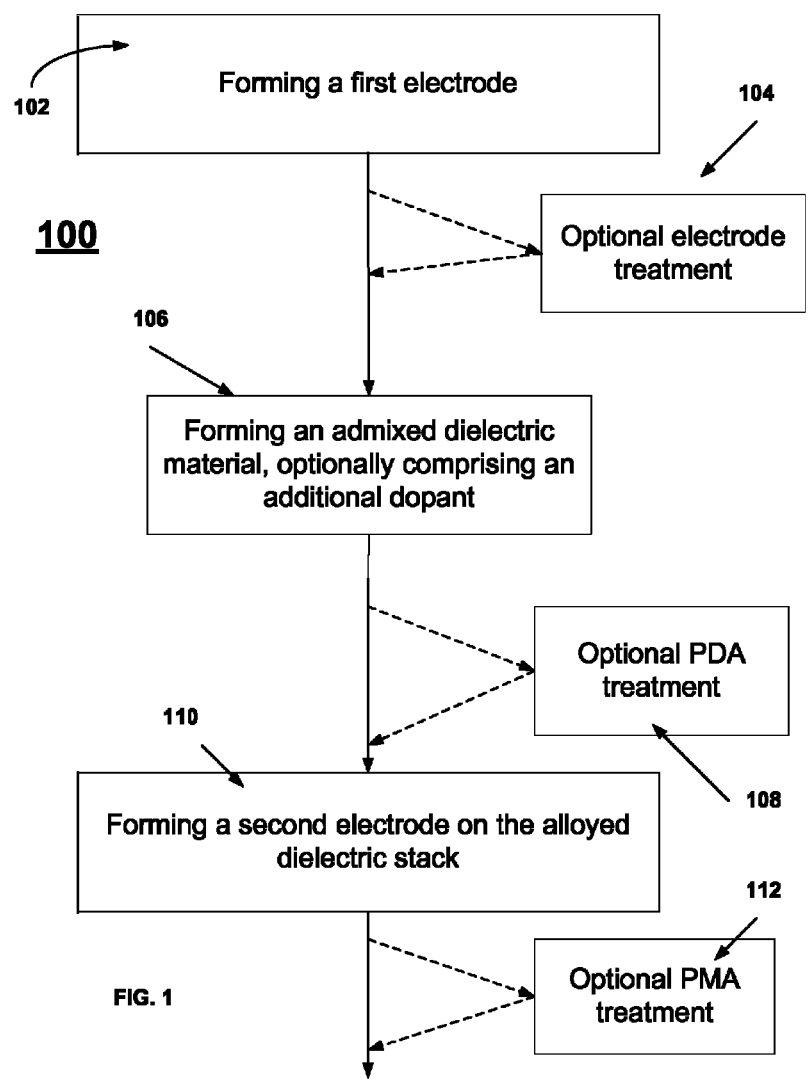
FIG. 1 illustrates a flow chart illustrating a method for fabricating a DRAM capacitor stack, in accordance with some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The dielectric constant of a dielectric material may be dependent upon the crystalline phase(s) of the material. For example, in the case of $TiO_2$, the anatase crystalline phase of $TiO_2$ has a dielectric constant of approximately 40, while the rutile crystalline phase of $TiO_2$ can have a dielectric constant of approximately >80. Due to the higher-k value of the rutile-phase, it is desirable to produce $TiO_2$ based DRAM capacitors with the $TiO_2$ in the rutile-phase. The relative amounts of the anatase phase and the rutile phase can be determined from x-ray diffraction (XRD). From Eqn. 1 above, a $TiO_2$ layer in the rutile-phase could be physically thicker and maintain the same desired capacitance as a $TiO_2$ layer in the anatase phase. The increased physical thickness is important for lowering the leakage current of the capacitor. The anatase phase will transition to the rutile phase at high temperatures (>8000). However, high temperature processes are undesirable in the manufacture of DRAM devices. Traditional annealing processes may degrade the underlying electrode due to oxidation or promote interaction between the $TiO_2$ and the electrode material. The degradation may lead to an increase in the EOT and/or increased device leakage.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and can serve as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode because they act more like insulators and have crystal structures that do not promote the deposition of the rutile-phase of $TiO_2$. For example, $MoO_3$ (the most oxygen-rich phase) is a dielectric material and has an orthorhombic crystal structure.

In a second example, TiN may be used as an electrode. TiN has a crystal structure of NaCl-type which is cubic. As such, TiN can serve as an acceptable template to promote the deposition of the tetragonal or cubic phases of $ZrO_2$. TiN has a high work function (can be ≥4.8 eV depending on process history) which is compatible with the higher band gap of $ZrO_2$. $ZrO_2$ is a dielectric material that can exhibit a k-value as high as ~45 depending on the processing conditions.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. The $MoO_{2+x}$ phases may form during the deposition of the electrode and may not be evenly distributed throughout the layer thickness. The $MoO_2$ electrode material may be deposited using any common deposition technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Typically, the $MoO_2$ electrode material must be annealed after deposition to fully crystallize the film. Even if the anneal is performed under an inert gas such as nitrogen, the presence of $MoO_{2+x}$ phases are observed and the effective k-value of the $TiO_2$ dielectric subsequently deposited on such an electrode is lower than desired.

FIG. 1 illustrates a method, 100, for forming a DRAM capacitor stack in accordance with some embodiments of the present invention. The initial step, 102, comprises forming a first electrode layer on a substrate. Examples of suitable electrode materials comprise metals, metal alloys, conductive metal oxides, conductive metal silicides, conductive metal nitrides, and combinations thereof. A particularly interesting class of materials is the conductive metal oxides. Optionally, the first electrode layer can be subjected to an annealing or treatment process in step, 104. The annealing or treatment process will depend on the composition of the first electrode. If the first electrode is a metal such as TiN, then the treatment of the first electrode layer may include annealing using a Rapid Thermal Anneal (RTA) technique wherein the temperature is quickly raised in the presence of a nitrogen containing gas such as $N_2$, forming gas, $NH_3$, etc. Examples of such electrode treatment steps are further described in U.S. application Ser. No. 13/051,531 filed on Mar. 18, 2011, which is incorporated herein by reference. Optionally, the first electrode may be annealed in a reducing atmosphere. This is especially advantageous if the first electrode is a conductive metal oxide. One example of such an annealing process is further described in U.S. application Ser. No. 13/084,666 filed on Apr. 12, 2011, entitled "METHOD FOR FABRICATING A DRAM CAPACITOR" and is incorporated herein by reference.

Continuing with FIG. 1, in step 106, a compound high k dielectric material is formed by admixing a high k material such as the rutile phase of $TiO_2$ with another high k material that has a larger band gap such as $ZrO_2$ or $HfO_2$. As used herein, a "compound high k dielectric material" will be understood to mean an admixture of different materials that forms a single phase. Although a compound high k dielectric material will be discussed as a specific example, other admixtures that do not form a single phase will also be understood to be within the scope of the present invention. That is, the formation of a single phase is not a limitation of the present invention. Additional dopants may also be added to the compound high k dielectric material to further reduce the leakage current. The compound high k dielectric material may be formed as a hybrid stack or a nanolaminate stack. Optionally, the dielectric layer can receive a post dielectric anneal (PDA) treatment in step 108. The PDA treatment serves to crystallize the dielectric layer and ensure that the material is fully oxidized. The next step, 110, comprises forming a second electrode layer on the compound high k dielectric material. The second electrode layer may be a conductive binary metal compound material as described above, a metal, or a combination thereof. The remaining full DRAM device (not shown) would then be manufactured using well known techniques. Optionally, the DRAM capacitor stack may undergo a post metallization anneal (PMA) treatment in step 112. Examples of the PDA treatment described above and the PMA treatment are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

Those skilled in the art will appreciate that each of the first electrode layer, the dielectric layer, and the second electrode layer used in the DRAM MIM capacitor may be formed using any common formation technique such as ALD, PE-ALD, AVD, UV-ALD, CVD, PECVD, or PVD. Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

Figure 2:
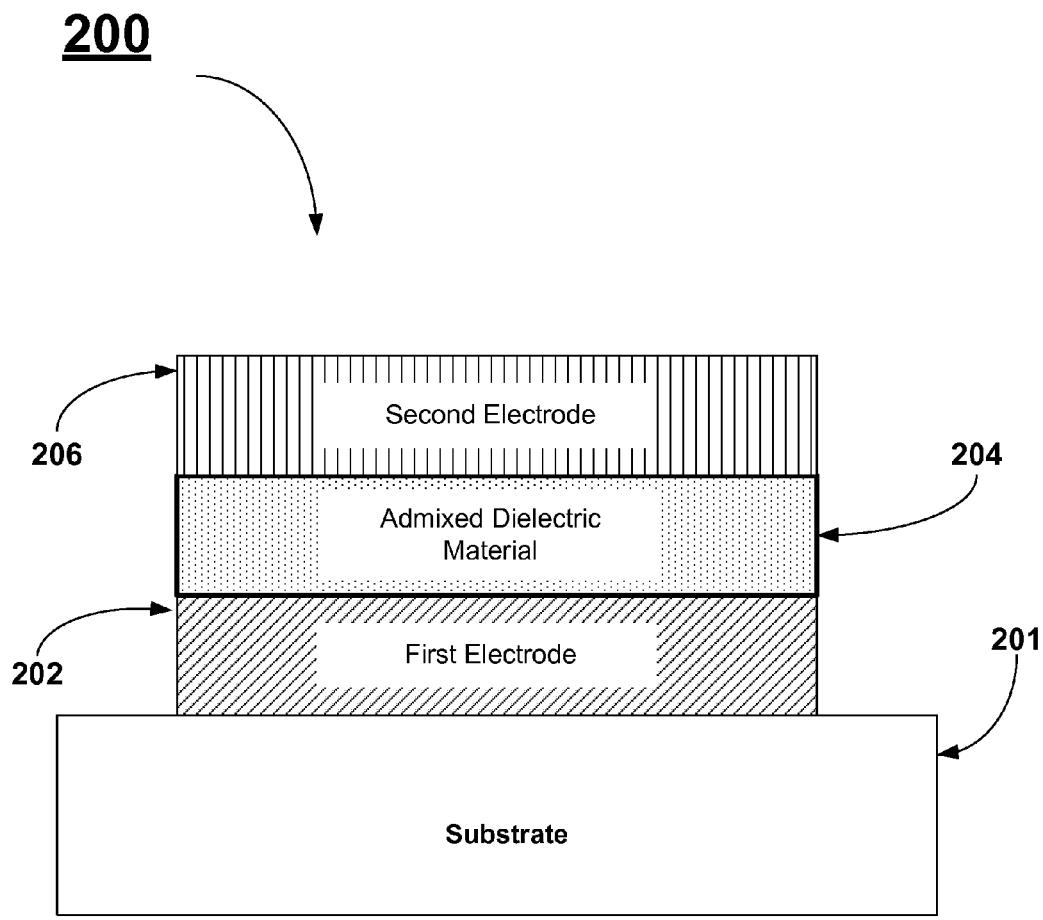
FIG. 2 illustrates a simplified cross-sectional view of a DRAM capacitor stack fabricated in accordance with some embodiments of the present invention.
Figure 3:
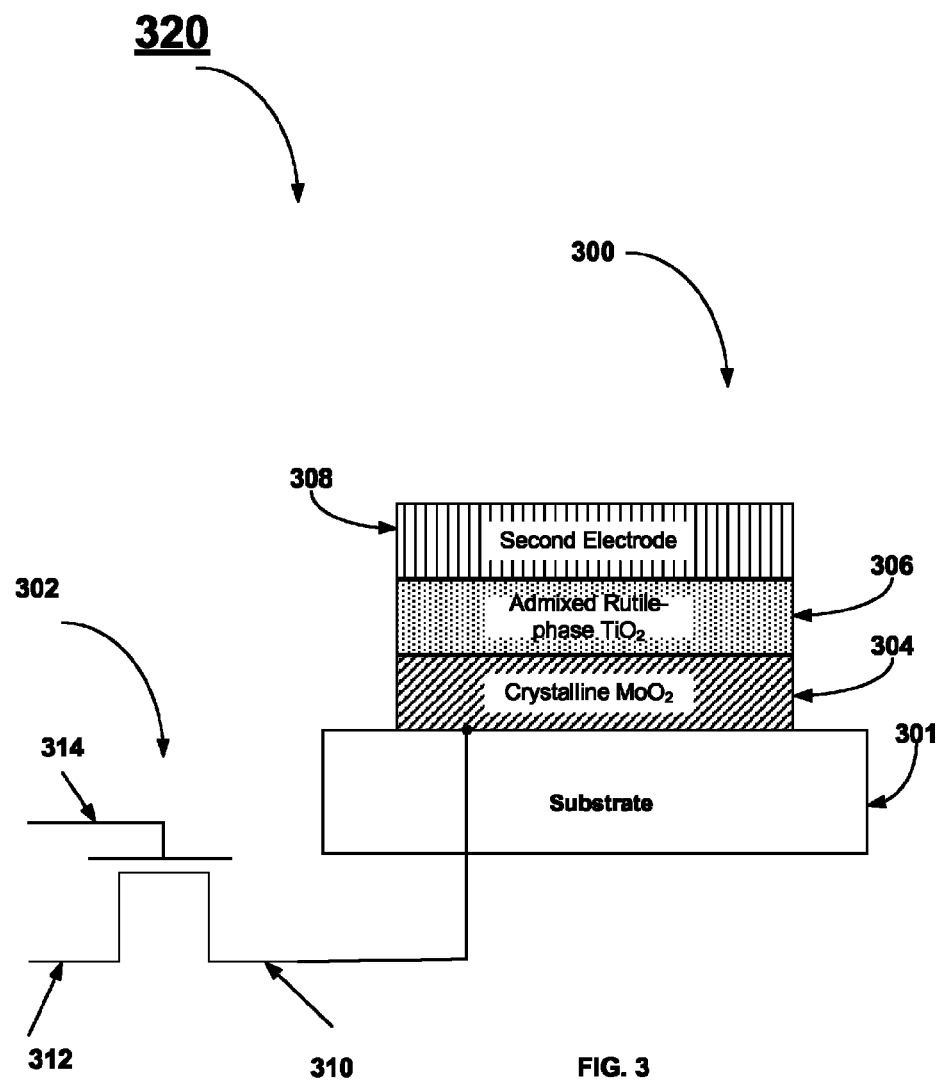
FIG. 3 illustrates a simplified cross-sectional view of a DRAM memory cell fabricated in accordance with some embodiments of the present invention.

In FIGS. 2, and 3 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

FIG. 2 illustrates a simple capacitor stack, 200, consistent with some embodiments of the present invention. Using the method as outlined in FIG. 1 and described above, first electrode layer, 202, is formed on substrate, 201. Generally, the substrate has already received several processing steps in the manufacture of a full DRAM device. First electrode layer, 202, comprises one of metals, metal alloys, conductive metal oxides, conductive metal nitrides, conductive metal silicides, conductive metal carbides, etc. Optionally, first electrode, 202, can be annealed to crystallize the material.

In the next step, a compound high k dielectric material, 204, would then be formed on the first electrode layer, 202 as an admixture of two or more high k materials. A wide variety of dielectric materials have been targeted for use in DRAM capacitors. Examples of suitable dielectric materials comprise SiO$_2$, a bilayer of SiO$_2$ and Si$_x$N$_y$, SiON, Al$_2$O$_3$, HfO$_2$, HfSiO$_x$, ZrO$_2$, Ta$_2$O$_5$, TiO$_2$, Nb$_2$O$_5$, SrTiO$_3$ (STO), BaSrTiO$_x$ (BST), PbZrTiO$_x$ (PZT), or doped versions of the same. Specific examples of interest are admixtures of TiO$_2$ and ZrO$_2$ and admixtures of TiO$_2$ and HfO$_2$. Table 1 below lists a number of properties for TiO$_2$, ZrO$_2$, and HfO$_2$ including their k value, bandgap (eV), conduction band offset (CBO) (eV), and valance band offset (VBO) (eV). However, other admixture combinations may also yield the benefits discussed previously. The compound high k dielectric material may be formed as a single layer or may be formed as a hybrid or nanolaminate structure. Typically, compound high k dielectric material, 204, is subjected to a PDA treatment before the formation of the second electrode as mentioned earlier. The PDA treatment serves to crystallize the compound high k material and repair defects in the compound high k material. The compound high k material may also comprise a dopant of a an element such as Al, Zr, Ge, Hf, Sn, Sr, Y, Si, Ti, La, Er, Ga, Gd, Mg, Co, or combinations thereof.

TABLE 1

| Material | k Value | Bandgap (eV) | CBO (eV) | VBO (eV) |
|---|---|---|---|---|
| TiO$_2$ | 30->170 | 3.1 | 0.00 | 1.90 |
| ZrO$_2$ | 25-43 | 5.8 | 1.50 | 3.20 |
| HfO$_2$ | 25 | 5.8 | 1.40 | 3.30 |

In the next step, the second electrode layer, 206, is formed on the compound high k dielectric material, 204. The second electrode layer may be a conductive binary metal compound material as described above, a metal, metal alloy, or a combination thereof.

An example of one embodiment will be described using FIG. 2 as a template. In a first step, a first electrode, 202, is formed on a substrate. Generally, the substrate has already received several processing steps in the manufacture of a full DRAM device. First electrode layer, 202, comprises one of metals, metal alloys, conductive metal oxides, conductive metal nitrides, conductive metal silicides, conductive metal carbides, etc. For this example, first electrode layer, 202, comprises a conductive metal oxide that may serve to promote the rutile phase of TiO$_2$. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. A specific electrode material of interest is the crystalline MoO$_2$ compound of molybdenum dioxide.

Optionally, first electrode, 202, can be annealed to crystallize the material. In the case of crystalline MoO$_2$, it is advantageous to anneal the first electrode in a reducing atmosphere to prevent the formation of oxygen-rich compounds as discussed earlier.

In one example of the present invention, a first electrode comprising between about 5 nm and about 10 nm of molybdenum oxide is formed on a substrate. The molybdenum oxide electrode material is formed at a process temperature between about 125 C and 250 C using an ALD process technology. Optionally, the substrate with the first electrode is then annealed in a reducing atmosphere comprising between about 1% and about 10% H$_2$ in N$_2$ and advantageously between about 5% and about 10% H$_2$ in N$_2$ at 500 C for between about 1 millisecond and about 60 minutes.

In the next step, compound high k dielectric material, 204, would then be formed on the annealed first electrode layer, 202. A wide variety of dielectric materials have been targeted for use in DRAM capacitors. Examples of suitable dielectric materials comprise SiO$_2$, a bilayer of SiO$_2$ and Si$_x$N$_y$, SiON, Al$_2$O$_3$, HfO$_2$, HfSiO$_x$, ZrO$_2$, Ta$_2$O$_5$, TiO$_2$, Nb$_2$O$_5$, SrTiO$_3$ (STO), BaSrTiO$_x$ (BST), PbZrTiO$_x$ (PZT), or doped versions of the same. Specific examples of interest are admixtures of TiO$_2$ and ZrO$_2$. The composition range of ZrO$_2$ may be between about 30 atomic % and about 80 atomic % and advantageously between about 40 atomic % and about 60 atomic %. The ZrO$_2$ atomic percent is calculated as ZrO$_2$/(ZrO$_2$+TiO$_2$) atomic percent. The compound high k material may also comprise a dopant of a an element such as Al, Zr, Ge, Hf, Sn, Sr, Y, Si, Ti, La, Er, Ga, Gd, Mg, Co, or combinations thereof. These compound high k materials may be formed as a single layer or may be formed as a hybrid or nanolaminate structure. Typically, compound high k material, 204, is subjected to a PDA treatment before the formation of the second electrode as discussed previously. A specific compound high k material of interest is TiO$_2$ admixed with ZrO$_2$ and doped with Al$_2$O$_3$ to between about 0 atomic % and about 15 atomic % Al where the Al atomic percent is calculated as Al/(Zr+Ti+Al) atomic percent.

In a specific example, the compound high k material comprises between about 6 nm to about 10 nm of TiO$_2$ admixed with ZrO$_2$ wherein at least 30% of the TiO$_2$ is present in the rutile phase. The composition range of ZrO$_2$ may be between about 30 atomic % and about 80 atomic % and advantageously between about 40 atomic % and about 60 atomic %. The ZrO$_2$ atomic percent is calculated as ZrO$_2$/(ZrO$_2$+TiO$_2$) atomic percent. Generally, the TiO$_2$/ZrO$_2$ compound high k material may either be a single film or may comprise a nanolaminate. If admixed in a 1:1 ratio, the TiO$_2$ and ZrO$_2$ form a ZrTiO$_4$ material with a bandgap of about 3.7 eV. Advantageously, the TiO$_2$/ZrO$_2$ compound high k material is doped with Al$_2$O$_3$ at a concentration between about 5 atomic % and about 15 atomic % Al where the Al atomic percent is calculated as Al/(Zr+Ti+Al) atomic percent. The TiO$_2$/ZrO$_2$ compound high k material is formed at a process temperature between about 200 C and 350 C using an ALD process technology. The substrate with the first electrode and compound high k material is then annealed in an oxidizing atmosphere comprising between about 0% O$_2$ to about 100% O$_2$ in N$_2$ and advantageously between about 0% O$_2$ to about 20% O$_2$ in N$_2$ at temperatures between about 400 C to about 600 C for between about 1 millisecond to about 60 minutes. The TiO$_2$ portion of the compound high k material imparts a high k value to the material, the ZrO$_2$ portion helps to reduce the leakage current because of the high bandgap, and the dopant portion helps to further reduce the leakage current due to the neutralization of free carriers induced by defects such as oxygen vacancies in the bulk dielectric films, by the acceptor-type dopants.

Second electrode, 206, is then formed on compound high k material, 204. The second electrode is typically a metal such as TiN, TaN, TiAlN, W, WN, Mo, Mo$_2$N, or others. Advantageously, the second electrode is TiN. The second electrode is typically between about 5 nm and 50 nm in thickness. Typically, the capacitor stack is then subjected to a PMA treatment as discussed previously.

In another example of the present invention, a first electrode comprising between about 5 nm and about 10 nm of molybdenum oxide is formed on a substrate. The molybdenum oxide electrode material is formed at a process temperature between about 125 C and 250 C using an ALD process technology. Optionally, the substrate with the first electrode is then annealed in a reducing atmosphere comprising between about 1% and about 10% H$_2$ in N$_2$ and advantageously between about 5% and about 10% $H_2$ in $N_2$ at 500 C for between about 1 millisecond and about 60 minutes.

In the next step, compound high k dielectric material, 204, would then be formed on the annealed first electrode layer, 202. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $Nb_2O_5$, $SrTiO_3$ (STO), $BaSrTiO_x$ (BST), $PbZrTiO_x$ (PZT), or doped versions of the same. Specific examples of interest are admixtures of $TiO_2$ and $HfO_2$. The composition range of $HfO_2$ may be between about 30 atomic % and about 80 atomic % and advantageously between about 40 atomic % and about 60 atomic %. The $HfO_2$ atomic percent is calculated as $HfO_2/(HfO_2+TiO_2)$ atomic percent. The compound high k dielectric material may also comprise a dopant of a an element such as Al, Zr, Ge, Hf, Sn, Sr, Y, Si, Ti, La, Er, Ga, Gd, Mg, Co, or combinations thereof. These compound high k dielectric materials may be formed as a single layer or may be formed as a hybrid or nanolaminate structure. Typically, compound high k dielectric material, 204, is subjected to a PDA treatment before the formation of the second electrode as discussed previously. A specific compound high k dielectric material of interest is $TiO_2$ admixed with $HfO_2$ and doped with $Al_2O_3$ to between about 0 atomic % and about 15 atomic % Al where the Al atomic percent is calculated as Al/(Zr+Ti+Al) atomic percent.

In a specific example, the compound high k material comprises between about 6 nm to about 10 nm of $TiO_2$ admixed with $HfO_2$ wherein at least 30% of the $TiO_2$ is present in the rutile phase. The composition range of $HfO_2$ may be between about 30 atomic % and about 80 atomic % and advantageously between about 40 atomic % and about 60 atomic %. The $HfO_2$ atomic percent is calculated as $HfO_2/(HfO_2+TiO_2)$ atomic percent. Generally, the $TiO_2/HfO_2$ compound high k material may either be a single film or may comprise a nanolaminate. If admixed in a 1:1 ratio, the $TiO_2$ and $HfO_2$ form a $HfTiO_4$ material with a bandgap of about 4.4 eV. Advantageously, the $TiO_2/HfO_2$ compound high k material is doped with $Al_2O_3$ at a concentration between about 5 atomic % and about 15 atomic % Al where the Al atomic percent is calculated as Al/(Zr+Ti+Al) atomic percent. The $TiO_2/HfO_2$ compound high k material is formed at a process temperature between about 200 C and 350 C using an ALD process technology. The substrate with the first electrode and compound high k material is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes. The $TiO_2$ portion of the compound high k material imparts a high k value to the material, the $HfO_2$ portion helps to reduce the leakage current because of the high bandgap, and the dopant portion helps to further reduce the leakage current due to the neutralization of free carriers induced by defects such as oxygen vacancies in the bulk dielectric films, by the acceptor-type dopants.

Second electrode, 206, is then formed on compound high k material, 204. The second electrode is typically a metal such as TiN, TaN, TiAlN, W, WN, Mo, $Mo_2N$, or others. Advantageously, the second electrode is TiN. The second electrode is typically between about 5 nm and 50 nm in thickness. Typically, the capacitor stack is then subjected to a PMA treatment as discussed previously.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 3 is used to illustrate one DRAM cell, 320, manufactured using a compound high k material as discussed previously. The cell, 320, is illustrated schematically to include two principle components, a cell capacitor, 300, and a cell transistor, 302. The cell transistor is usually constituted by a MOS transistor having a gate, 314, source, 310, and drain, 312. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 2, the cell capacitor, 300, comprises a first electrode, 304, formed on substrate, 301. The first electrode, 304, is connected to the source or drain of the cell transistor, 302. For illustrative purposes, the first electrode has been connected to the source, 310, in this example. For the purposes of illustration, first electrode, 304, will be crystalline $MoO_2$ in this example. As discussed previously, first electrode, 304, may be subjected to an anneal in a reducing atmosphere before the formation of the dielectric layer to crystallize the $MoO_2$ and to reduce any $MoO_{2+x}$ compounds that may have formed during the formation of the first electrode. Compound high k material, 306, is formed on top of the first electrode. For the purposes of illustration, compound high k material, 306, will be rutile-phase $TiO_2$ admixed with either $ZrO_2$ or $HfO_2$ and optionally doped with Al. Typically, the compound high k material is then subjected to a PDA treatment. The second electrode, 308, is then formed on top of the compound high k material. For the purposes of illustration, the second electrode, 308, will be TiN in this example. This completes the formation of the capacitor stack. Typically, the capacitor stack is then subjected to a PMA treatment.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a capacitor stack comprising:
   forming a first electrode layer on a substrate,
      the first electrode layer comprising $MoO_2$;
   forming a compound high k dielectric material on the first electrode layer,
      wherein the compound high k dielectric material is formed by admixing two or more high k dielectric material components,
      wherein one of the two or more high k dielectric material components comprises $TiO_2$,
      wherein at least 30% of $TiO_2$ is present in a rutile phase, and wherein a concentration of one of the components of the compound high k dielectric material is in the range between about 30 atomic % and about 80 atomic %; and forming a second electrode on the compound high k dielectric material.

2. The method of claim 1 wherein the concentration of the one of the two or more high k dielectric material components of the compound high k material is in the range between about 40 atomic % and about 60 atomic %.

3. The method of claim 1 wherein another one of the two or more high k dielectric material components is selected from the group consisting of $SiO_2$, a bilayer of $SiO_2$ and $Si_xN_y$, SiON, $Al_2O_3$, $HfO_2$, $HfSiO_x$, $ZrO_2$, $Ta_2O_5$, $Nb_2O_5$, $SrTiO_3$ (STO), $BaSrTiOx$ (BST), and $PbZrTiO_x$ (PZT).

4. The method of claim 3 wherein another one of the two or more high k dielectric material components comprises $ZrO_2$.

5. The method of claim 4 wherein the concentration of the $ZrO_2$ is in the range between about 30 atomic % and about 80 atomic %.

6. The method of claim 5 wherein the concentration of the $ZrO_2$ is in the range between about 40 atomic % and about 60 atomic %.

7. The method of claim 4 wherein the compound high k dielectric material comprises a dopant.

8. The method of claim 7 wherein the dopant is one of Al, Ge, Hf, Sn, Sr, Y, Si, La, Er, Ga, Gd, Mg, Co, or combinations thereof.

9. The method of claim 7 wherein the dopant comprises $Al_2O_3$ and wherein the Al is present in an amount between about 5 atomic % and about 15 atomic %.

10. The method of claim 3 wherein the other one of the two or more high k dielectric material components comprises $HfO_2$.

11. The method of claim 10 wherein the concentration of the $HfO_2$ is in the range between about 30 atomic % and about 80 atomic %.

12. The method of claim 11 wherein the concentration of the $HfO_2$ is in the range between about 40 atomic % and about 60 atomic %.

13. The method of claim 10 wherein the compound high k dielectric material comprises a dopant.

14. The method of claim 13 wherein the dopant is one of Al, Zr, Ge, Sn, Sr, Y, Si, La, Er, Ga, Gd, Mg, Co, or combinations thereof.

15. The method of claim 13, wherein the dopant comprises $Al_2O_3$ and wherein the Al is present in an amount between about 5 atomic % and about 15 atomic %.

16. The method of claim 1, wherein the second electrode is TiN.

17. The method of claim 16 wherein the compound high k dielectric material further comprises a dopant of $Al_2O_3$.

18. The method of claim 10 wherein the second electrode is TiN.

19. The method of claim 18 wherein the compound high k dielectric material further comprises a dopant of $Al_2O_3$.

* * * * *